(12) United States Patent
Chung et al.

(10) Patent No.: US 9,553,158 B2
(45) Date of Patent: Jan. 24, 2017

(54) THIN FILM TRANSISTOR ARRAY SUBSTRATE AND A THIN FILM TRANSISTOR WHICH COMPRISE A CONDUCTIVE STRUCTURE COMPRISING A BLOCKING LAYER AND A DIFFUSION PREVENTION LAYER

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Jaemoon Chung, Beijing (CN); Qiuping Huang, Beijing (CN); Seong Sil Im, Beijing (CN); Dongseob Kim, Beijing (CN); Chao-Huan Hsu, Beijing (CN); Huawei Xu, Beijing (CN); Zhengwei Chen, Beijing (CN); Jianshe Xue, Beijing (CN)

(73) Assignees: HEFEI XINSHENG OPTOELECTRONICS TECHNOLOGY CO., LTD., Hefei, Anhui (CN); BOE TECHNOLOGY GROUP CO., LTD., Beijing (CN)

(*) Notice: Subject to any disclaimer, the term of this patent is extended or adjusted under 35 U.S.C. 154(b) by 149 days.

(21) Appl. No.: 13/877,745

(22) PCT Filed: Oct. 17, 2012

(86) PCT No.: PCT/CN2012/083106
§ 371 (c)(1),
(2) Date: Apr. 4, 2013

(87) PCT Pub. No.: WO2013/149463
PCT Pub. Date: Oct. 10, 2013

(65) Prior Publication Data
US 2014/0124784 A1    May 8, 2014

(30) Foreign Application Priority Data

Apr. 1, 2012  (CN) .......................... 2012 1 0096583

(51) Int. Cl.
*H01L 23/532* (2006.01)
*H01L 29/49* (2006.01)
(Continued)

(52) U.S. Cl.
CPC ..... *H01L 29/4908* (2013.01); *H01L 21/28008* (2013.01); *H01L 21/3205* (2013.01);
(Continued)

(58) Field of Classification Search
CPC ..................... H01L 23/53228; H01L 23/53238
(Continued)

(56) References Cited

U.S. PATENT DOCUMENTS

| 5,930,655 A | 7/1999 | Cooney, III et al. |
| 2007/0122649 A1 | 5/2007 | Lee et al. |

(Continued)

FOREIGN PATENT DOCUMENTS

| CN | 1182956 A | 5/1998 |
| CN | 1964067 A | 5/2007 |

(Continued)

OTHER PUBLICATIONS

First Office Action issued by the Chinese Patent Office for Chinese Patent Application No. 201210096583.3 dated Feb. 8, 2014, 8pgs.
(Continued)

*Primary Examiner* — Eduardo A Rodela
*Assistant Examiner* — Christopher M Roland

(57) ABSTRACT

Embodiments of the invention provide a conductive structure, a thin film transistor, an array substrate, and a display device. The conductive structure comprises a copper layer formed of copper or copper alloy; a blocking layer for preventing copper ions of the copper layer from diffusing
(Continued)

outward; and a diffusion prevention layer for preventing exterior ions from diffusing to the copper layer and disposed between the copper layer and the blocking layer. The multilayer conductive structure according to an embodiment of the invention can prevent exterior ions from diffusing into a copper layer and prevent copper ions from diffusing outward to reduce ions diffusion that adversely impacts the electricity performance and chemical corrosion resistance of the copper metal layer, and meanwhile can enhance adhesiveness of the conductive structure, which may be helpful for etching/patterning of the multilayer conductive structure.

4 Claims, 1 Drawing Sheet

(51) Int. Cl.
*H01L 21/28* (2006.01)
*H01L 27/12* (2006.01)
*H01L 29/423* (2006.01)
*H01L 29/45* (2006.01)
*H01L 21/3205* (2006.01)

(52) U.S. Cl.
CPC .. *H01L 23/53228* (2013.01); *H01L 23/53238* (2013.01); *H01L 27/124* (2013.01); *H01L 29/42384* (2013.01); *H01L 29/458* (2013.01); *H01L 2924/0002* (2013.01); *Y10T 428/12826* (2015.01); *Y10T 428/265* (2015.01); *Y10T 428/31678* (2015.04)

(58) Field of Classification Search
USPC .......................... 257/762, E23.161; 438/687
See application file for complete search history.

(56) References Cited

U.S. PATENT DOCUMENTS

| | | |
|---|---|---|
| 2007/0236641 A1 | 10/2007 | Ning et al. |
| 2008/0315203 A1 | 12/2008 | Hino et al. |
| 2011/0062587 A1 | 3/2011 | Yang et al. |
| 2013/0032188 A1* | 2/2013 | Kajihara et al. .............. 136/200 |

FOREIGN PATENT DOCUMENTS

| | | |
|---|---|---|
| CN | 101051644 A | 10/2007 |
| CN | 101330102 A | 12/2008 |
| CN | 102664193 A | 9/2012 |
| CN | 202678317 U | 1/2013 |

OTHER PUBLICATIONS

English translation of First Office Action issued by the Chinese Patent Office for Chinese Patent Application No. 201210096583.3 dated Feb. 8, 2014, 6pgs.
International Search Report for International Application No. PCT/CN2012/083106, 13pgs.
Second Office action (Chinese language) issued by the State Intellectual Property Office ("SIPO") on Sep. 28, 2014 for application No. 2012100965833, 4 pages.
English translation of second Office action issued by SIPO (listed above), 4 pages.
English translation of PCT International Preliminary Report on Patentability issued by the International Searching Authority for application No. PCT/CN2012/083106, 10 pages.
Rejection Decision (Chinese language) issued by the State Intellectual Property Office of People's Republic of China, in Chinese patent application No. 201210096583.3, dated Jul. 10, 2015, 6 pages.
English translation of Rejection Decision issued by the State Intellectual Property Office of People's Republic of China, in Chinese patent application No. 201210096583.3, dated Jul. 10, 2015, 4 pages.
Third Office action (Chinese language) issued by the State Intellectual Property Office ("SIPO") on Mar. 16, 2015 for application No. 201210096583.3, 7 pages.
English translation of Third Office action issued by SIPO Mar. 16, 2015 (listed above), 7 pages.
English language Abstract of CN101330102A (listed in Foreign Patent Documents above); 1 page.
English abstract of CN101051644A, 1 page.
English abstract of CN102664193A, 2 pages.

* cited by examiner

THIN FILM TRANSISTOR ARRAY SUBSTRATE AND A THIN FILM TRANSISTOR WHICH COMPRISE A CONDUCTIVE STRUCTURE COMPRISING A BLOCKING LAYER AND A DIFFUSION PREVENTION LAYER

TECHNICAL FIELD

Embodiments of the invention relate to a conductive structure and a method for manufacturing the same, a thin film transistor, an array substrate and a display device.

BACKGROUND

A thin film transistor (TFT) array substrate can be used in a liquid crystal display (LCD) and an organic light emitting device (OLED). A liquid crystal display generally comprises a thin film transistor array substrate, a color filter substrate and a liquid crystal layer interposed between these two substrates. When an electric field is formed between the two substrates, orientation of liquid crystal molecules varies to change light transmittance for displaying an image. A organic light emitting display device displays an image by using an organic electroluminescent material. A pixel of the organic light emitting display device generally comprises a driving thin film transistor for providing current to the organic electroluminescent material and a switch thin-film transistor for controlling the driving thin film transistor to be turned on or off.

These display devices may comprise gate lines and data lines to drive pixel units. The gate lines and data lines are required to have lower resistance as the size of the display device increases and the demand for a display performance enhances. At present, commonly used aluminum wirings can not meet requirements for the display performance due to high resistivity. Copper has much lower resistivity than aluminum, and therefore it will be a main selection of using copper for gate lines and data lines in future.

However, copper ions have relatively high penetrability and can easily diffuse into an amorphous silicon or silicon layer configured for an active layer of the thin film transistor, for example. In addition, copper ions, which will be generated during etching metallic conductive layers or striping off photoresist, may also penetrated into the amorphous silicon layer, which may influence performance of the amorphous silicon layer (such as a thin film transistor). In addition, silicon ions and the other metallic ions may also easily diffuse into a copper conductive structure so that the resistivity of the copper conductive structure is increased and resistance against chemical corrosion thereof is reduced.

SUMMARY

An embodiment of the invention provides a conductive structure, which can prevent exterior ions from diffusing to a copper layer and copper ions in the copper layer from diffusing outward to reduce an adverse influence caused by ion diffusions.

According to an aspect of the invention, an embodiment of the invention provides a conductive structure comprising: a copper layer formed of copper or copper alloy; a blocking layer for preventing copper ions of the copper layer from diffusing outward; and a diffusion prevention layer for preventing exterior ions from diffusing to the copper layer and disposed between the copper layer and the blocking layer.

For example, in the above conductive structure, a material of the blocking layer is molybdenum alloy, and a material of the diffusion prevention layer is molybdenum.

For example, in the above conductive structure, the molybdenum alloy is any one or a mixture of more than two of MoNb, MoW, MoTi and MoZr.

For example, in the above conductive structure, an atom percentage of element(s) except Mo in the molybdenum alloy is between 0.001 at % and 50 at %.

For example, in the above conductive structure, a thickness of the blocking layer is 50 Å to 1000 Å, and a thickness of the diffusion prevention layer is 30 Å to 200 Å.

An embodiment of the invention provides a thin film transistor comprising a gate electrode, a source electrode and a drain electrode, at least one of which employ the above conductive structure.

According to another aspect of the invention, an embodiment of the invention provides a thin film transistor array substrate comprising: a substrate; a thin film transistor array, gate lines and data lines formed on the substrate, the thin film transistor array comprising a plurality of thin film transistor each of which comprises a gate electrode, a source electrode and a drain electrode; and pixel electrodes formed in pixel regions defined by the gate lines and the date lines intersecting the gate lines; wherein at least one of the data lines, the source electrodes, the gate lines, the gate electrodes and the drain electrodes employ the above conductive structure.

An embodiment of the invention also provides a display device comprising the above thin film transistor array substrate.

An embodiment of the invention also provides a method for manufacturing a conductive structure comprising: forming a blocking layer on a substrate for preventing copper ions from diffusing to the substrate; forming a diffusion prevention layer on the blocking layer for preventing ions from diffusing upward through the blocking layer; and forming a copper layer with copper or copper alloy on the diffusion prevention layer.

For example, in the above method, the blocking layer is formed by a sputtering process with molybdenum alloy as a sputtering source; the diffusion prevention layer is formed by a sputtering process with molybdenum as a sputtering source; and the copper layer is formed by a sputtering process with copper or copper alloy as a sputtering source.

For example, a material of the molybdenum alloy is any one or a mixture of more than two of MoNb, MoW, MoTi and MoZr.

The conductive structure having a multilayer structure and the method for manufacturing the same provided in embodiments of the invention can prevent exterior ions from diffusing into a copper layer and prevent copper ions from diffusing outward through the multilayer structure, reducing or avoiding ions diffusion that adversely impacts the electricity performance and chemical corrosion resistance of the copper metal layer and the influence of diffusions of copper ions to the substrate; the blocking layer in the conductive structure have good adhesiveness to a semiconductor layer or a substrate such as a glass substrate and so on, and can enhance the adhesiveness stability of the conductive structure; and each layer in the multilayer conductive structure has a similar etching selectivity, which may be helpful for etching/patterning the multilayer conductive structure. Thus the thin film transistor, the array substrate, and the display device provided in embodiments of the invention employing the above conductive structure can also produce the above effect.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

REFERENCE NUMERALS

1—Substrate; 2a—a blocking layer; 2b - - - a diffusion prevention layer 2c - - - a copper layer; 5 - - - a gate electrode; 6 - - - a gate insulation layer; 7 - - - an intrinsic semiconductor layer; 8 - - - an contact semiconductor layer; 9a - - - a data line; 9b - - - a source electrode; 9c - - - a drain electrode; 10 - - - a protection layer; 11 - - - a pixel electrode; 12 - - - a via hole; 13 - - - a substrate.

DETAILED DESCRIPTION

In order to make objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

An embodiment of the invention does not employ a copper conductive structure only but employs a multilayer conductive structure to decrease or avoid copper ions of a copper layer from diffusing outwardly and decrease or avoid exterior ions from diffusing to the copper layer due to high diffusivity of copper ions. The multilayer conductive structure of the embodiment of the invention can also overcome the problem that a current copper conductive structure has relatively low adhesiveness to an insulation substrate (for example, a glass substrate or a semiconductor layer) and thus are easy to come off.

An embodiment of the invention provides a multilayer conductive structure, which may be reliably patterned to form a proper lateral profile.

Figure 1:
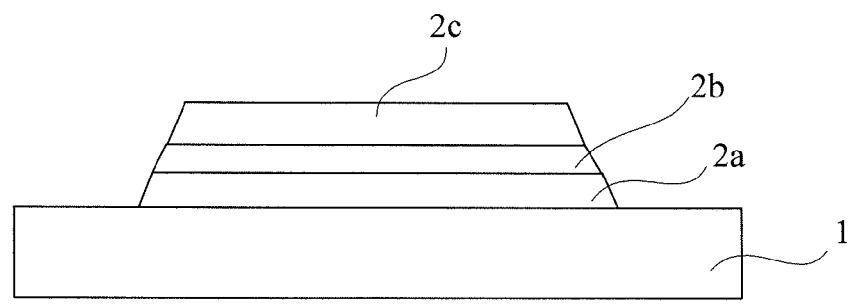
FIG. 1 is a schematic structural view of a conductive structure provided in an embodiment of the invention.

As shown in FIG. 1, the conductive structure comprises a copper layer 2c formed of copper or copper alloy, a blocking layer 2a for blocking copper ions of the copper layer 2c from diffusing outwardly, and a diffusion prevention layer 2b for blocking exterior ions from diffusing to the copper layer 2c and disposed between the copper layer 2c and the blocking layer 2a.

In the aforesaid structure, the blocking layer 2a may be formed on a substrate 1. The substrate 1 may be a base substrate, such as a glass substrate, a quartz substrate, a plastic substrate and so on, and may also be one or several films on an electronic component, such as a gate insulation layer, a semiconductor layer, a passivation layer of a thin film transistor or the like. Other intermediate film layers such as a buffer layer and so on may also be formed between the substrate 1 and the blocking layer 2a. The substrate 1 may be in a single-layer structure, and may also be a structure having two or more layers. The substrate 1 may concurrently comprise different regions of an electronic device, for example, the blocking layer 2a may be concurrently formed on an active layer and a gate insulation layer (that is, the active layer together with the gate insulation layer form the substrate 1) when a drain electrode of an array substrate is made by employing the conductive structure.

The thickness of each layer is determined by a required interface state and an etching status when the above conductive structure is applied to a thin film transistor. For example, the thickness of the blocking layer 2a may be 50 Å to 1000 Å, and the thickness of the diffusion prevention layer 2b may be 30 Å to 200 Å, and the thickness of the copper layer 2c may be 1000 Å to 5000 Å.

The diffusion prevention layer 2b can block exterior ions (such as ions in the blocking layer 2a or in the substrate 1) from diffusing into the copper layer 2c with the above structure to ensure the conductive property and chemical corrosion resistance of the copper layer; meanwhile, the copper ions in the copper layer 2c may also be blocked by the blocking layer 2a and thus are hard to diffuse into the substrate 1 so that an influence to the substrate 1 can be reduced or avoided.

In the present embodiment, a material of the blocking layer 2a is molybdenum alloy as a preferred example. The molybdenum alloy may be any one of MoNb, MoW, MoTi and MoZr, and may also be a mixture consisting of two or more material from the above materials.

The blocking layer 2a employing molybdenum alloy has good adhesiveness to the substrate 1 (such as a base substrate or a semiconductor layer), which can enhance adhesion between the substrate 1 and the conductive structure and thus can improve stability between the conductive structure and the substrate 1; the blocking layer 2a can also prevent copper ions from diffusing into the substrate 1, and exhibits a similar etch selectivity to the diffusion prevention layer 2b and the copper layer 2c, which is helpful for etching them simultaneously during an etching/a patterning process for a multi-layered structure.

In the present embodiment, when the blocking layer 2a is formed of a molybdenum alloy, elements in the molybdenum alloy except Mo is for example between 0.001 at % to 50 at %. For example, when the molybdenum alloy is MoNb, the atom percentage of Nb in the molybdenum alloy is between 0.001 at % to 50 at %, and when the molybdenum alloy is MoNb and MoTi, Nb and Ti in the molybdenum alloy is between 0.001 at % to 50 at % together.

In order to prevent metallic ions in the blocking layer 2a from diffusing to the copper layer 2c, which may in turn result in deterioration of the electricity performance and chemical corrosion resistance of the copper layer 2c, in the above configuration a diffusion prevention layer 2b is further deposited between the blocking layer 2a and the copper layer 2c. The diffusion prevention layer 2b has a material of a crystal structure similar to that of the blocking layer 2a and that of the copper layer 2c, which can ensure adhesiveness at the interface between the blocking layer 2a and the diffusion prevention layer 2b and at the interface between the diffusion prevention layer 2b and the copper layer 2c, and also has an etching selectivity similar to that of the blocking layer 2a and that of the copper layer 2c. For example, a diffusion prevention material is molybdenum (Mo) in a cubic-centered crystal structure, which has a similar crystal structure to the molybdenum alloy (for example MoNb) and belongs to the same isometric system together as copper with a face-centered cubic crystal structure, thus good interfacial performance can be ensured. The conductive structure formed by the above method has good interfacial characteristic and etching property, and the multilayer conductive structure can be reliably patterned during a patterning process so as to form a good lateral profile. The blocking layer may contact with the other film layers when the conductive structure is applied to a specific electronic device, and here the diffusion prevention layer 2b may also prevent metallic ions in the other film layers in contact with the blocking layer from diffusing to the copper layer 2c.

The conductive structure of the embodiment can reduce or avoid the copper layer 2c from being eroded and oxidized, and can be closely attached to the substrate, and also can effectively overcome a problem that the electricity performance and chemical corrosion resistance of the copper layer is deteriorated because metallic ions or other impurities diffuse into the copper layer.

Correspondingly, the present embodiment also provides a method for manufacturing a conductive structure as shown in FIG. 1, and the method comprises the following steps.

Firstly, a blocking layer 2a is formed on a substrate 1 to block copper ions from diffusing to the substrate, and then a diffusion prevention layer 2b is formed on the blocking layer 2a to block ions from diffusing upwardly through the blocking layer, and thereafter, a copper layer 2c is formed of copper or copper alloy on the diffusion prevention layer 2b.

Here, all of the blocking layer 2a, the diffusion prevention layer 2b and the copper layer 2c may be formed by a sputtering process. For example, the blocking layer 2a is formed by employing molybdenum alloy as a sputtering source, the diffusion prevention layer 2b is formed by employing molybdenum as a sputtering source, and the copper layer 2c is formed by employing copper or copper alloy as a sputtering source. The material of the molybdenum alloy may be any one of MoNb, MoW, MoTi and MoZr or a mixture of two of the above materials. The aforesaid layers may be formed in another manner, such as chemical vaporization method or physical deposition method and so on, which will not be described in detail here for simplicity.

After forming of the above structure, the aforesaid structure in the present embodiment may be processed by a further patterning process, such as coating photoresist, exposure and development, and etching and so on, to obtain a finally desired pattern.

The above conductive structure may be applied to a thin film transistor and a thin film transistor array substrate. Therefore, an embodiment of the invention also provides a thin film transistor which can generally comprise a gate electrode, a source electrode and a drain electrode; at least one of the gate electrode, the source and drain electrodes employ the above conductive structure. Other portion of the thin film transistor except for the portion employing the above conductive structure and the overall structure of the thin film transistor are not limited in the invention.

An embodiment of the invention also provides a thin film transistor array substrate which can generally comprise a substrate; a thin film transistor array, gate lines and data lines formed on the substrate, the thin film transistor array comprising a plurality of thin film transistors, each of which comprises a gate electrode, a source electrode and a drain electrode; and a pixel electrode in one of regions defined by the gate lines and data lines intersecting the gate lines; at least one of the data lines, the source electrodes, the gate lines, the gate electrodes and the drain electrodes on the array substrate employs the above conductive structure. For example, the gate lines are connected with corresponding gate electrodes, the data lines are connected with corresponding source electrodes, and the pixel electrodes are connected with corresponding drain electrodes.

In the embodiment, in the thin film transistor array substrate, a gate line and a gate electrode constitute a gate conductive structure, and a data line, a source electrode and a drain electrode constitute a data conductive structure. The gate lines are formed on the substrate and extend along a first direction, and the data lines are formed on the gate insulating layer and extend along a second direction. Here, the first direction may be perpendicular to the second direction. The drain electrode and the source electrode are disposed spaced apart from each other. A pixel electrode is formed in a pixel region defined by a gate line and a data line intersecting the gate line and electrically connected with a drain electrode.

In the present embodiment, any one element in the gate conductive structure and the data conductive structure, such as the gate electrode, the gate line or drain electrode and so on, can employ the conductive structure as shown in FIG. 1.

Hereinafter, a thin film transistor array substrate according to an embodiment of the invention will be described in detail with reference to FIG. 2.

Figure 2:
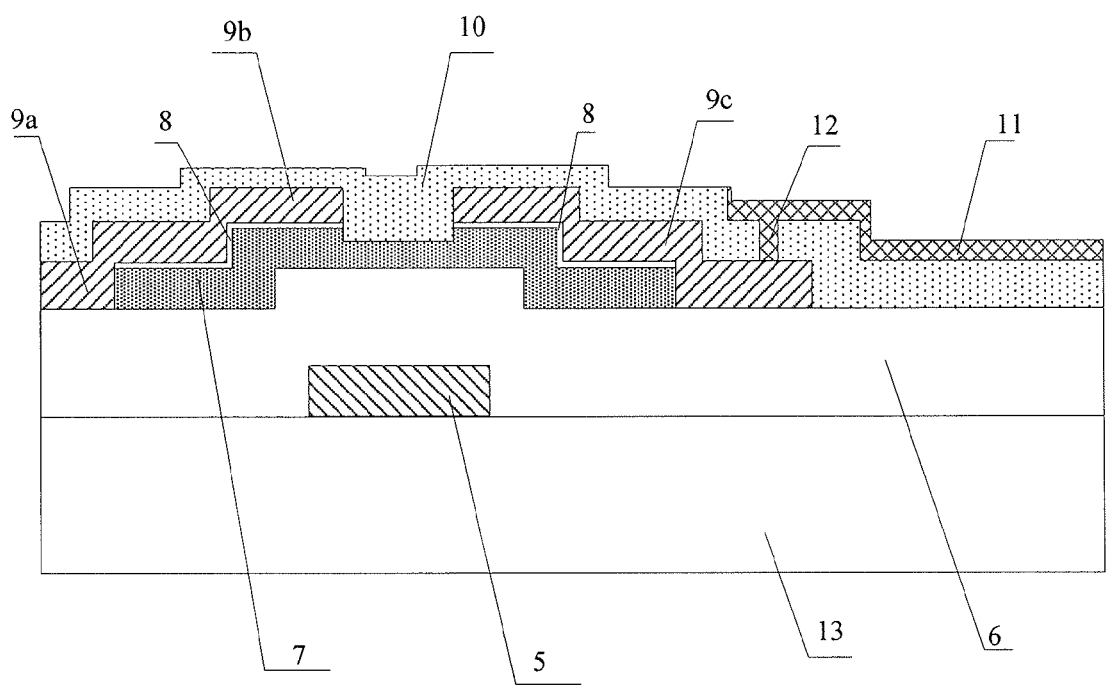
FIG. 2 is a schematic structural view of a thin film transistor array substrate provided in an embodiment of the invention.

The array substrate as shown in FIG. 2 may be applied to a liquid crystal display or an organic light emitting display device, and comprises a base substrate 13 and at least one gate conductive structure 5 provided on the base substrate 13. Here, the gate conductive structure 5 comprises a gate electrode and a gate line; the gate electrode and/or the gate line may employ the conductive structure as shown in FIG. 1, that is, comprise a blocking layer, a diffusion prevention layer and a copper layer. Here, the blocking layer is formed on the base substrate 13 and its material may be molybdenum alloy (for example, one or more of MoNb, MoW, MoTi, MoZr and so on), and the atom percentage of Nb (or W, Ti, Zr and so on) in the alloy is in a range of 0.001 at % to 50 at %, for example. The thickness of the blocking layer is determined by desired interface state and etching status, for example, may be between 50 Å to 1000 Å. The diffusion prevention layer is formed on the blocking layer, and the diffusion prevention material is molybdenum (Mo), the thickness of the diffusion prevention layer is determined by desired interface state and etching status, for example, may be between 30 Å and 200 Å. The copper layer is formed of a material of copper metal or copper alloy and on the diffusion prevention layer.

The gate conductive structure consisted of the blocking layer, the diffusion prevention layer and the copper layer can overcome the defect that the adhesiveness between the copper wire and the substrate base is bad in the existing technology; the blocking layer consisted of molybdenum alloy can improve the adhesiveness between the copper layer and the substrate and prevent copper ions from diffusing to the substrate; the diffusion prevention layer formed of molybdenum (Mo) material can prevent Nb (or W, Ti, Zr and so on) ions from diffusing to the copper layer, and thus prevent deterioration of the electricity performance and chemical corrosion resistance of the copper metal layer due to the aforesaid ion diffusion, and ensure the low resistance value characteristic of the copper metal layer. Meanwhile, the blocking layer, the diffusion prevention layer and the copper layer may have similar etched characteristics during an etching process so as to easily form a good pattern by an etching process, reducing a manufacturing cost.

The array substrate shown in FIG. 2 further comprises a gate insulating layer 6 disposed on the base substrate 13, and the gate insulating layer 6 covers the gate conductive structure 5. A channel element (i.e., an active layer) is configured on the gate insulation layer 6 and comprises an intrinsic semiconductor layer 7 and an ohmic contact semiconductor layer 8. The ohmic contact semiconductor layer 8 is configured on the intrinsic semiconductor layer 7. Of course, the active layer may also comprise an organic semiconductor, a metal oxide semiconductor (such as IGZO) or the like.

The array substrate shown in FIG. 2 further comprises at least one data conductive structure which is configured on the channel element. The data conductive structure comprises a data line 9a, a source electrode 9b and a drain electrode 9c. The data line 9a is disposed on the gate insulating layer 6. The source electrode 9b and the drain electrode 9c are disposed on the channel element, and the source electrode 9b is electrically connected with the data line 9a and is disposed spaced apart from the drain electrode 9c. Any one or more than two of the data line 9a, the source electrode 9b and the drain electrode 9c can employ the conductive structure shown in FIG. 1, that is, may comprises a blocking layer, a diffusion prevention layer and a copper layer. Here, the blocking layer is formed on the gate insulation layer 6 or the channel element, and its material may be molybdenum alloy (for example, one or more of MoNb, MoW, MoTi, MoZr and so on), and the atom percentage of Nb (or W, Ti, Zr and so on) in the alloy is in a range of 0.001 at % to 50 at %, for example. The thickness of the blocking layer is determined by desired interface state and etching status, for example, may be between 50 Å to 1000 Å. The diffusion prevention layer is formed on the blocking layer, and the material of the diffusion prevention is molybdenum (Mo), the thickness of the diffusion prevention layer is determined by desired interface state and etching status, for example, may be between 30 Å and 200 Å. The copper layer is formed on the diffusion prevention layer, and its material may be copper or copper alloy layer.

The data conductive structure composed of the blocking layer, the diffusion prevention layer and the copper layer can overcome the defect that the adhesiveness at the interface between the copper conductor and the semiconductor layer is not good. The blocking layer composed of molybdenum alloy can overcome the defect that the adhesiveness at the interface between the copper conductor and the semiconductor layer is not good, and can prevent inter-diffusions of copper atoms and silicon atoms between the copper metal layer and the semiconductor layer, and reduce or avoid ions diffusion from adversely impacting the electricity performance of the semiconductor layer and the copper layer. The diffusion prevention layer formed of molybdenum (Mo) can prevent Nb (or W, Ti, Zr and so on) ions in the blocking layer from diffusing to the copper layer, prevent deterioration of the electricity performance and chemical corrosion resistance of the copper metal layer, and ensure a lower resistance value of the copper metal layer. Meanwhile, the blocking layer, the diffusion prevention layer and the copper layer may have similar etched characteristics during an etching process, so as to easily form a good pattern by the etching process and reduce manufacturing costs.

The array substrate shown in FIG. 2 further comprises a protection layer 10, which is disposed on the data line 9a, the source and drain electrodes 9b and 9c and the gate insulating layer 6; a pixel electrode 11 is disposed on the protection layer 10 and is electrically connected with the drain electrode 9c through a via hole 12.

Other portion of the array substrate described in the embodiment of the invention except the portion employing the above conductive structure and the overall structure of the thin film transistor array substrate are not limited to the above configurations, and for example, may further comprise a common electrode to form an array substrate in an ADS type, or may form an array substrate in a color filter on array (COA) form and so on, which is not described in detail here.

An embodiment of the invention further provides a display device, and the display device comprises a display device employing any one of the thin film transistor array substrates described in the above embodiment. The display device may be a liquid crystal device, an electronic paper display device, or OLED display device and so on, and for example, may be used to any products or components having a display function, such as a mobile telephone, a tablet computer, a television set, a notebook computer, a digital picture frame, a navigator and so on.

The above description involves only illustrative examples of the present invention. It should be noted that those skilled in the related art, without departing from the spirit of the invention, can make modification or variation, which should be deemed as falling within the protection scope of the invention.

The invention claimed is:

1. A thin film transistor comprising a gate electrode, a source electrode and a drain electrode, at least one of which employ a conductive structure comprising:
   a copper layer formed of copper or copper alloy;
   a blocking layer for preventing copper ions of the copper layer from diffusing outward; and
   a diffusion prevention layer for preventing exterior ions from diffusing to the copper layer and disposed between the copper layer and the blocking layer,
   wherein a material of the blocking layer is molybdenum alloy which is any one or a mixture of more than two of MoNb, MoW, MoTi and MoZr, and
   a material of the diffusion prevention layer is molybdenum.

2. The thin film transistor of claim 1, wherein an atom percentage of element(s) except Mo in the molybdenum alloy is between 0.001 at % and 50 at %.

3. The thin film transistor of claim 1, wherein a thickness of the blocking layer is 50 Å to 1000 Å, and a thickness of the diffusion prevention layer is 30 Å to 200 Å.

4. A thin film transistor array substrate comprising:
   a substrate;
   a thin film transistor array, gate lines and data lines formed on the substrate, the thin film transistor array comprising a plurality of thin film transistor each of which comprises a gate electrode, a source electrode and a drain electrode; and
   pixel electrodes formed in pixel regions defined by the gate lines and the date lines intersecting the gate lines;
   wherein at least one of the data lines, the source electrodes, the gate lines, the gate electrodes and the drain electrodes employs a conductive structure comprising:
   a copper layer formed of copper or copper alloy;
   a blocking layer for preventing copper ions of the copper layer from diffusing outward; and
   a diffusion prevention layer for preventing exterior ions from diffusing to the copper layer and disposed between the copper layer and the blocking layer,
   wherein a material of the blocking layer is molybdenum alloy which is any one or a mixture of more than two of MoNb, MoW, MoTi and MoZr, and
   a material of the diffusion prevention layer is molybdenum.

* * * * *